(12) United States Patent
Kuramoto

(10) Patent No.: US 7,425,733 B2
(45) Date of Patent: Sep. 16, 2008

(54) SEMICONDUCTOR APPARATUS WITH ELECTROSTATIC PROTECTIVE DEVICE

(75) Inventor: Takafumi Kuramoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/745,113

(22) Filed: May 7, 2007

(65) Prior Publication Data

US 2007/0262343 A1 Nov. 15, 2007

(30) Foreign Application Priority Data

May 15, 2006 (JP) .............................. 2006-135317

(51) Int. Cl.
*H01L 23/62* (2006.01)
*H01L 29/96* (2006.01)

(52) U.S. Cl. ................. 257/173; 257/183; 257/355; 257/E29.325; 257/E29.327

(58) Field of Classification Search ................. 257/173, 257/183, 355, E29.325, E29.327
See application file for complete search history.

(56) References Cited

U.S. PATENT DOCUMENTS

| 6,198,135 B1 * | 3/2001 | Sonoda | 257/355 |
| 6,770,918 B2 * | 8/2004 | Russ et al. | 257/173 |
| 6,946,707 B2 * | 9/2005 | Voldman | 257/355 |

FOREIGN PATENT DOCUMENTS

| JP | 10-200056 A | 7/1998 |
| JP | 2002-313799 A | 10/2002 |
| JP | 2004531047 | 10/2004 |
| KP | 10-0407574 | 12/2003 |
| KP | 1020050059609 | 6/2005 |
| WO | 0237566 | 5/2002 |

* cited by examiner

*Primary Examiner*—Evan Pert
(74) *Attorney, Agent, or Firm*—Sughrue Mion, PLLC (57) ABSTRACT

A semiconductor apparatus includes an electrostatic protective device having PN junction with N-type Si and P-type SiGe. The electrostatic protective device is directly connected with a terminal to receive static electricity and with a terminal to discharge static electricity.

10 Claims, 7 Drawing Sheets

$E_G$: BAND GAP ENERGY $E_C$: ENERGY AT LOWER LIMIT OF CONDUCTION BAND

$E_V$: ENERGY AT UPPER LIMIT OF VALENCE BAND $E_F$: FERMI LEVEL $\phi$: BUILT-IN POTENTIAL

*Fig. 1*

$E_G$: BAND GAP ENERGY $E_C$: ENERGY AT LOWER LIMIT OF CONDUCTION BAND $E_V$: ENERGY AT UPPER LIMIT OF VALENCE BAND $E_F$: FERMI LEVEL $\phi$: BUILT-IN POTENTIAL

RELATED ART $E_G$ : BAND GAP ENERGY $E_C$ : ENERGY AT LOWER LIMIT OF CONDUCTION BAND

$E_V$ : ENERGY AT UPPER LIMIT OF VALENCE BAND $E_F$ : FERMI LEVEL $\phi$ : BUILT-IN POTENTIAL

*Fig. 9*

RELATED ART

*Fig. 10*

RELAED ART

Fig. 11

RELATED ART

SEMICONDUCTOR APPARATUS WITH ELECTROSTATIC PROTECTIVE DEVICE

BACKGROUND OF THE INVENTION

1. Field of the Invention

The present invention relates to a semiconductor apparatus capable of preventing electrostatic discharge damage.

2. Description of Related Art

With an increase in the degree of integration and the speed of semiconductor apparatus, electrostatic discharge damage that is caused by electrostatic discharge (ESD) which occurs when handling semiconductor apparatus has emerged as a significant problem. A resistance to electrostatic discharge damage which can cause breakdown of semiconductor apparatus decreases as a device becomes smaller and a high-speed but fragile semiconductor material/structure is introduced. An example of the high-speed semiconductor material and structure is a SiGe heterojunction bipolar transistor, which uses SiGe for a base region to reduce a band gap of the base region to be smaller than a band gap of an emitter region, thereby increasing the emitter injection efficiency to improve high-frequency characteristics. Another example is a SiGe:C heterojunction bipolar transistor, which adds Carbon (C) to the SiGe base for the purpose of reducing lattice distortion due to Ge and suppressing diffusion of Boron (B) to obtain a shallow and high-concentration base.

Figure 11:
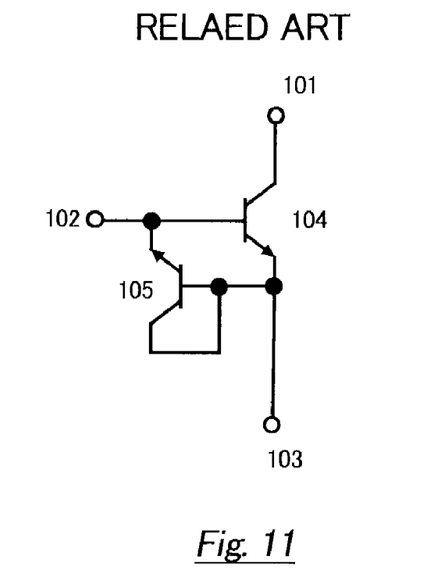
FIG. 11 is a circuit diagram where an NPN Si bipolar transistor is used as an electrostatic protective device according to a related art.

An electrostatic protective device having the PN junction with N-type Si and P-type Si has been used. FIG. 11 shows a protective transistor using an NPN Si bipolar transistor which is disclosed in Japanese Unexamined Patent Publication No. 10-200056. The emitter of the protective transistor 105 is connected with a terminal 102 to be protected from electrostatic discharge damage. The base and the collector of the protective transistor 105 are short-circuited and connected with a terminal 103 to discharge static electricity. In this example, a circuit to be protected is a Si bipolar transistor 104, which has the base connected with the terminal 102 and the emitter connected with the discharge terminal 103. This structure aims at protection from electrostatic discharge damage when static electricity is applied between the base and the emitter of the Si bipolar transistor 104. If positive static electricity is applied to the base of the NPN Si bipolar transistor, forward current flows between the base and the emitter, which rarely causes breakdown. On the other hand, if negative static electricity is applied, a reverse bias is established and no current flows between the base and the emitter, in which case a voltage can reach a breakdown limit. With the use of the protective transistor 105 having the N—Si emitter connected with the terminal 102 and the P—Si base connected with the discharge terminal 103, a forward bias is applied to the protective transistor 105 upon application of negative static electricity so that negative charges are discharged through the emitter and the base, thereby protecting the bipolar transistor from breakdown.

Figure 12:
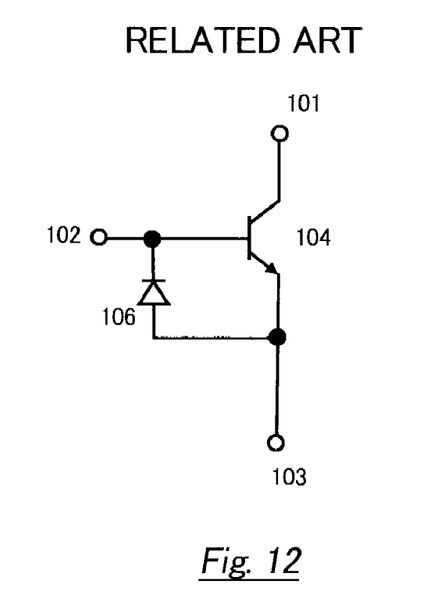
FIG. 12 is a circuit diagram where a PN Si diode is used as an electrostatic protective device according to a related art.

FIG. 12 shows an example of using a PN Si diode 106 instead of the NPN Si bipolar transistor 105. The cathode of the PN Si diode 106 is connected with the terminal 102 to be protected from electrostatic discharge damage, and the anode of the PN Si diode 106 is connected with the terminal 103 to discharge static electricity. Because the cathode is N-type Si and the anode is P-type Si, this structure can also protect the bipolar transistor 104 in the same manner as the structure using the NPN Si bipolar transistor.

Figure 13:
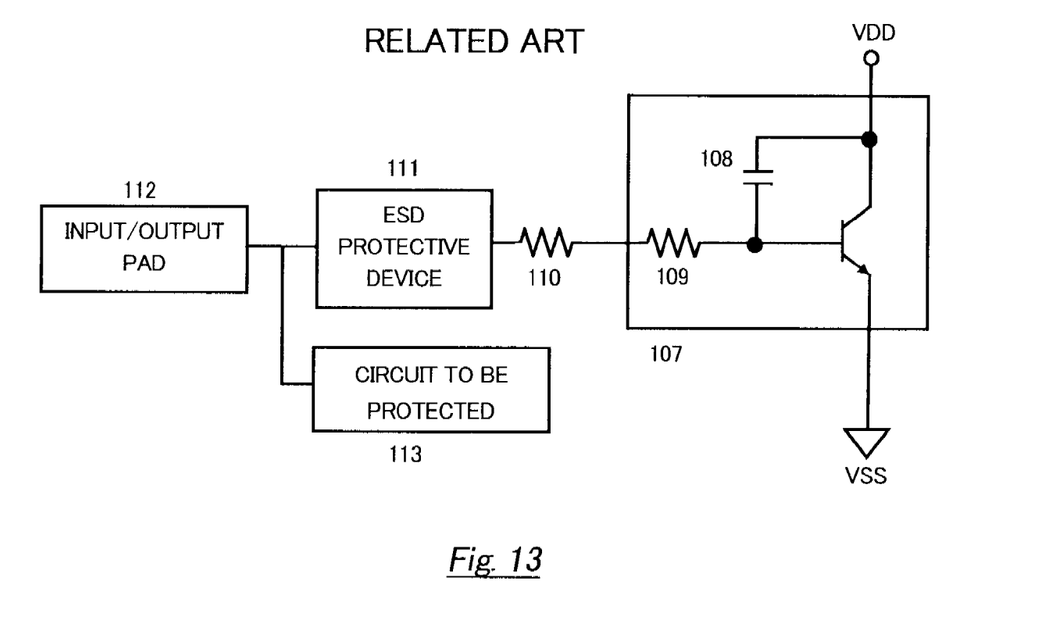
FIG. 13 is a circuit diagram where a SiGe bipolar transistor and resistors are used as an electrostatic protective device according to a related art.

FIG. 13 shows an example of an electrostatic protective device using a SiGe bipolar transistor which is disclosed in Japanese Unexamined Patent Publication No. 2002-313799. An external ESD protective device 111 which is connected with an input/output pad 112 of a circuit 113 to be protected, an external resistor 110, and an ESD protective circuit 107 are connected in series. The ESD protective circuit 107 includes an internal resistor 109, an internal capacitor 108 and a SiGe bipolar transistor having a collector and an emitter connected with a power supply voltage VDD and VSS, respectively. The external ESD protective device is composed of a SiGe Schottky diode, a SiGe transistor, a SiGe varistor, or a SiGe diode.

However, the electrostatic protective device using the Si PN junction and the electrostatic protective device using the SiGe bipolar transistor disclosed in Japanese Unexamined Patent Publication No. 2002-313799 have the following problems.

Figure 9:
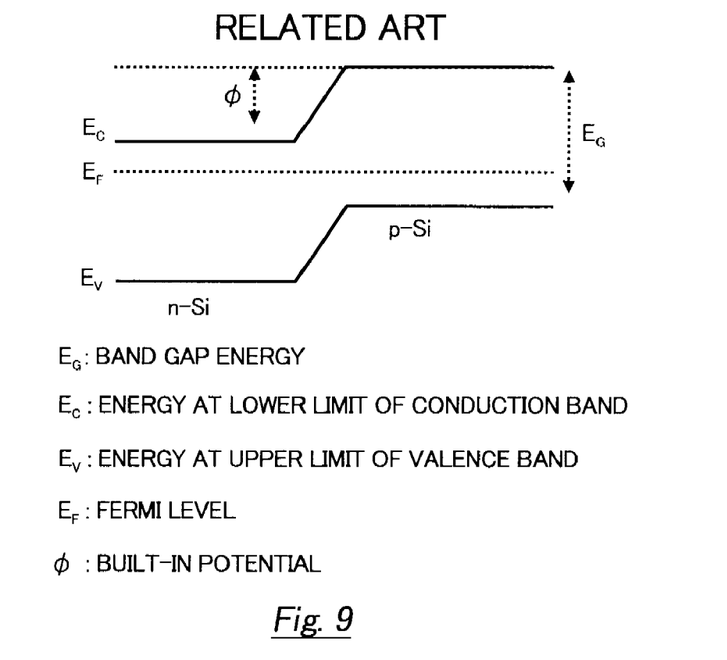
FIG. 9 is a PN junction band diagram of a Si bipolar transistor according to a related art.

With the use of the electrostatic protective device using the Si PN junction, a Fermi level is close to the lower limit of a conduction band in N-type and it is close to the upper limit of a valence band in P-type as shown in a band width diagram of PN junction in FIG. 9. Therefore, a built-in potential is determined by the band gap of Si, and the ON-state voltage at which current starts flowing upon application of a forward voltage is 1.1V or higher. Thus, when static electricity is applied to a terminal to be protected, no current flows to an electrostatic protective device until reaching the ON-state voltage, which results in a low electrostatic discharge resistance.

With the use of the electrostatic protective device using the SiGe bipolar transistor disclosed in Japanese Unexamined Patent Publication No. 2002-313799, the external resistor 110 and the internal resistor 109 are connected in series through a discharge path. Thus, when static electricity is applied to a terminal to be protected and current starts flowing, voltage drop occurs in the resistors and a voltage is not sufficiently applied to the PN junction to cause lower discharge current, which also results in a low electrostatic discharge resistance.

SUMMARY

In one embodiment of the present invention, there is provided a semiconductor apparatus including an electrostatic protective device having PN junction with N-type Si and P-type SiGe. The electrostatic protective device is directly connected with a terminal to receive static electricity and with a terminal to discharge static electricity.

Figure 2:
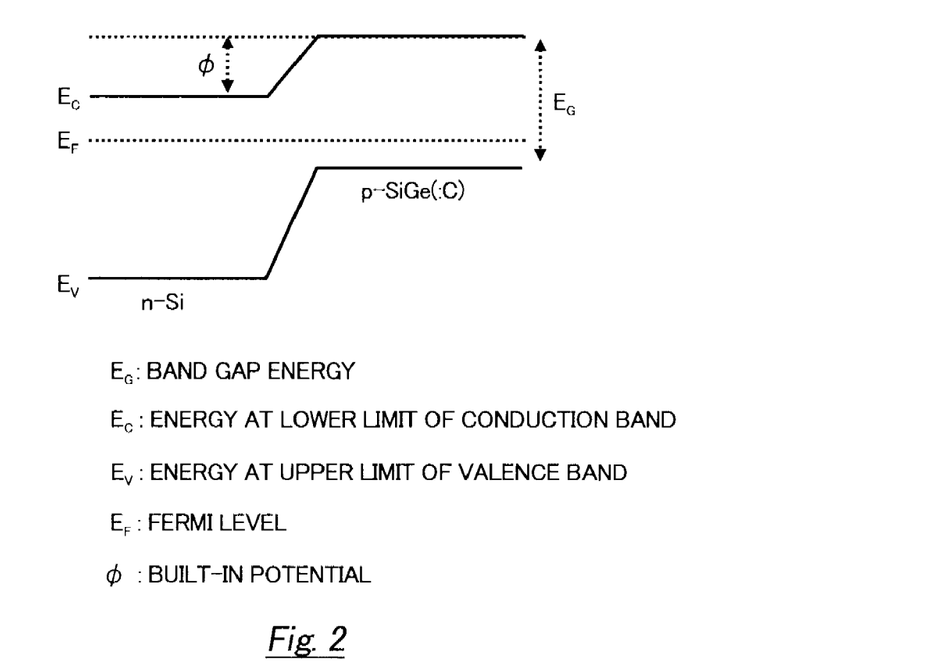
FIG. 2 is a PN junction band diagram of a SiGe:C bipolar transistor according to the first embodiment of the present invention.

In the semiconductor apparatus of the above aspect of the present invention, a Fermi level is close to the lower limit of a conduction band in N-type Si and it is close to the upper limit of a valence band in P-type SiGe as shown in a band diagram of PN junction in FIG. 2. Therefore, a built-in potential is determined by the band gap of SiGe. The band gap of SiGe can be designed between the band gap of Si and Ge, i.e. 1.1V and 0.66V respectively, by composition ratio, thereby enabling the significant reduction of the ON-state voltage compared with Si. If static electricity is applied to a terminal to be protected, it reaches the ON-state voltage more quickly than Si so that current starts flowing to an electrostatic protective device, which provides a higher electrostatic discharge resistance.

Further, in comparison with the electrostatic protective device using the SiGe bipolar transistor disclosed in Japanese Unexamined Patent Publication No. 2002-313799, the voltage drop due to an external resistor or an internal resistor does not occur and therefore enough voltage for obtaining large discharge current is applied to the PN junction, which provides a higher electrostatic discharge resistance.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The present invention achieves a higher electrostatic discharge resistance by using an electrostatic protective device having the PN junction with N-type Si and P-type SiGe.

First Embodiment

Figure 1:
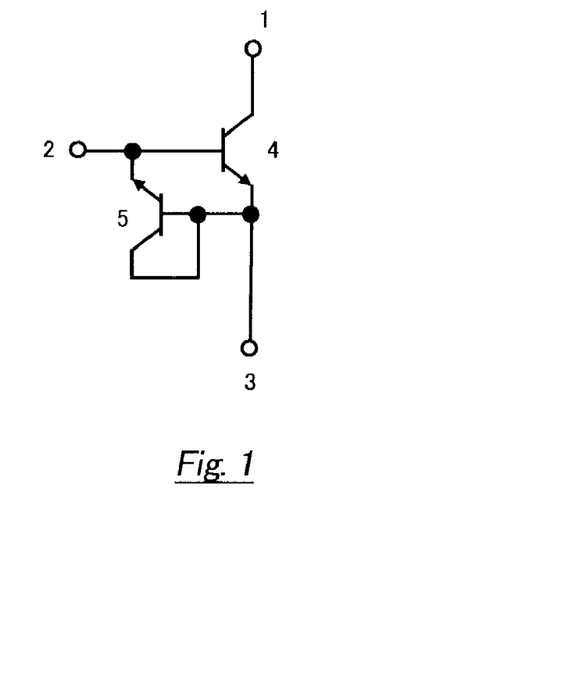
FIG. 1 is a circuit diagram according to a first embodiment of the present invention.

FIG. 1 shows a first embodiment of the present invention. An electrostatic protective device is a SiGe:C bipolar transistor 5, which is a SiCe bipolar transistor that contains Carbon (C) at its base, with an emitter area of 10 $\mu m^2$. The emitter of the SiGe:C bipolar transistor 5 is connected with a terminal 2 to be protected, and the base and the collector of the SiGe:C bipolar transistor 5 is connected with a terminal 3 to discharge static electricity. In this embodiment, a circuit to he protected is a SiGe:C bipolar transistor 4, which has the base connected with the terminal 2 and the emitter connected with the terminal 3, with an emitter area of 30 $\mu m^2$. The SiGe:C bipolar transistor 5 as an electrostatic protective device is a P-type SiGe in which its emitter is N-type Si and its base contains C. The base-emitter junction forms the PN junction, and the emitter and the base are directly connected with the terminals 2 and 3, respectively.

If negative static electricity is applied to the terminal 2, the forward bias is applied between the base and the emitter of the SiGe:C bipolar transistor 5 as an electrostatic protective device. Thus, the negative charge is discharged through the emitter and the base, thereby protecting the SiGe:C bipolar transistor 4 from breakdown.

In this embodiment, the experimental result shows that the built-in potential of a band diagram shown in FIG. 2 is lower than the built-in potential of the Si PN junction by 0.05V. As a result of the measurement of an electrostatic discharge resistance in the circuit of this embodiment by machine modeling, an electrostatic discharge resistance of 80V is obtained, which is ten times higher than the resistance without the electrostatic protective device, that is 8V.

Figure 3:
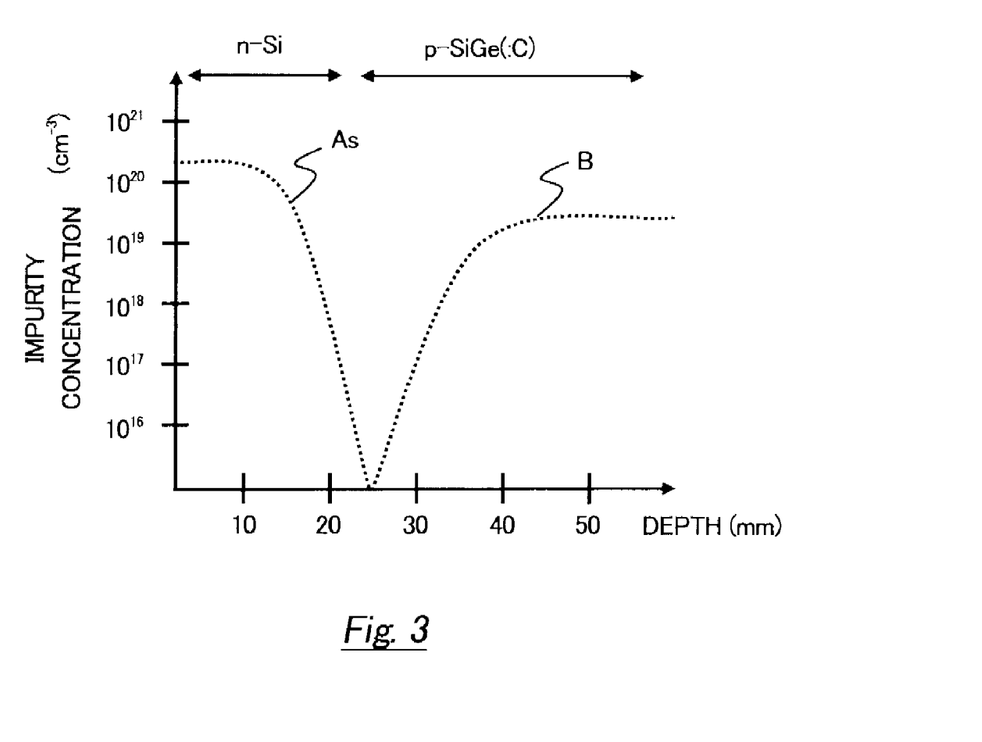
FIG. 3 is a graph showing impurity concentration distribution in the PN junction of the SiGe:C bipolar transistor according to the first embodiment of the present invention.
Figure 10:
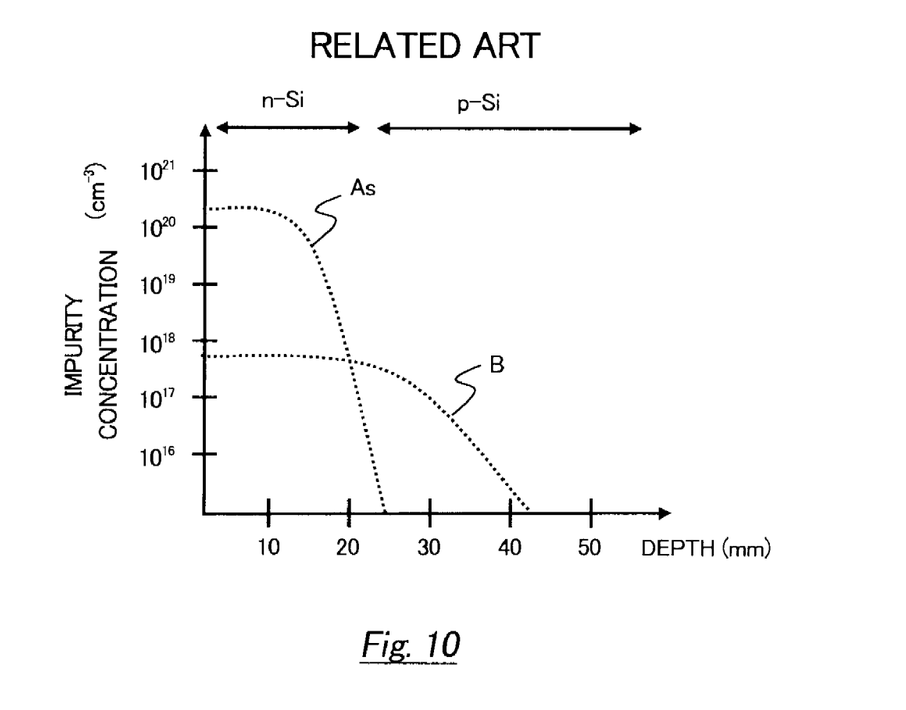
FIG. 10 is a graph showing impurity concentration distribution in the PN junction of a Si bipolar transistor according to a related art.

Further, because a diffusion coefficient of B is smaller in SiGe or SiGe:C crystal than in Si crystal, the concentration of B can be lower in the PN junction and its vicinity than in other region. FIG. 3 shows the concentration distribution of N-type impurity Arsenic (As) and P-type impurity Boron (B) in the PN junction of the SiGe:C bipolar transistor as an electrostatic protective device of this embodiment. In this embodiment, the concentration of B inside SiGe:C is $4E19\ cm^{-3}$, and the concentration of B in the PN junction and its vicinity is $1E15\ cm^{-3}$. FIG. 10 shows the concentration distribution of N-type impurity Arsenic (As) and P-type impurity Boron (B) in normal Si crystal. As shown in FIG. 10, the concentration of B in the PN junction and its vicinity is $4E17\ cm^{-3}$ or higher due to the diffusion of B. Thus, the internal B concentration of SiGe:C is 100 times that of the normal Si crystal, and the B concentration around the PN junction of SiGe:C is $1/100$ times that of the normal Si crystal. A decrease in the concentration of B around the PN junction allows an increase in the depth of a depletion layer upon application of a reverse bias voltage, which reduces parasitic capacitance of the PN junction to improve various high-frequency characteristics. Further, an increase in the concentration of B inside the base allows the reduction of resistance upon discharge of static electricity, which promotes the discharge to improve the electrostatic discharge resistance.

In this embodiment, the capacity of the SiGe:C bipolar transistor 5 as an electrostatic protective device is 100 fF, which is lower than that of a Si bipolar transistor of the same area, which is 120 fF, by about 20%. The high-frequency characteristics are also suitable with a noise factor at 2 GHz of 0.48 dB.

Figure 4:
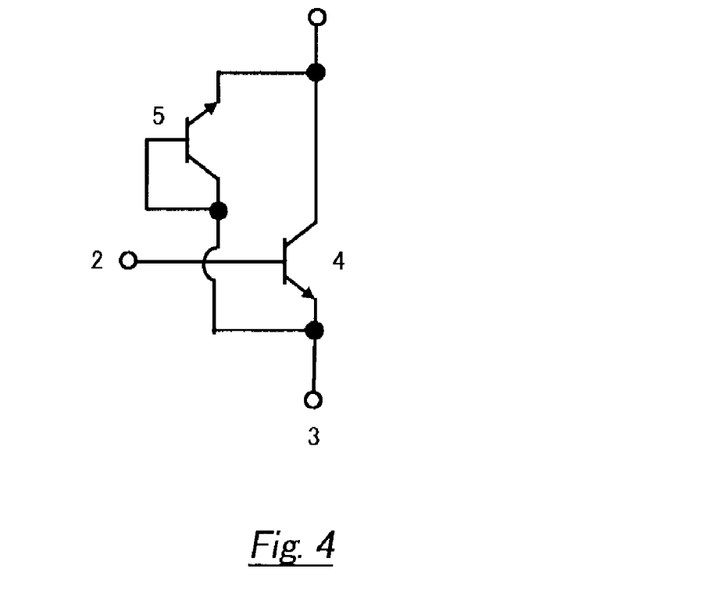
FIG. 4 is a circuit diagram where an electrostatic protective device is placed between a base and a collector according to the first embodiment of the present invention.

FIG. 4 shows an example where the SiGe:C bipolar transistor 4 is protected from electrostatic discharge damage between the emitter and the collector. The emitter of the SiGe:C bipolar transistor 5, which serves as an electrostatic protective device, is connected with the collector of the SiGe:C bipolar transistor 4, and the base and the collector of the SiGe:C bipolar transistor 5 are short-circuited and connected with the emitter of the SiGe:C bipolar transistor 4.

Second Embodiment

Figure 5:
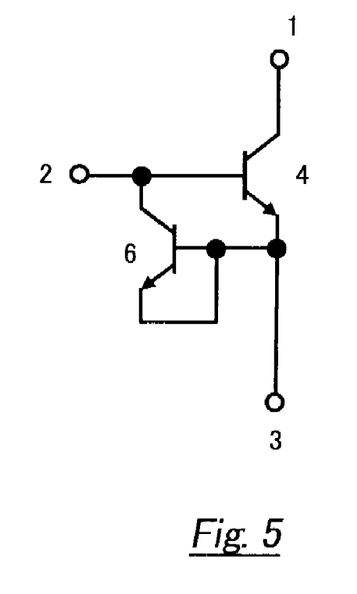
FIG. 5 is a circuit diagram according to a second embodiment of the present invention.

FIG. 5 shows a second embodiment of the present invention. The electrostatic protective device is a SiGe:C bipolar transistor 6, which is similar to the equivalent of the first embodiment. The collector of the SiGe:C bipolar transistor 6 is connected with the terminal 2 to be protected, and the base and the emitter of the SiGe:C bipolar transistor 6 are connected with the terminal 3 to discharge static electricity. In this embodiment, the N-type Si collector and the P-type SiGe base containing C form the PN junction. Because a junction area is normally larger in the collector-base junction than in the emitter-base junction in a bipolar transistor having an emitter at the upper side, this embodiment allows the obtainment of a larger PN junction with the same size of SiGe:C bipolar transistor, thereby further improving the electrostatic discharge resistance.

Third Embodiment

Figure 6:
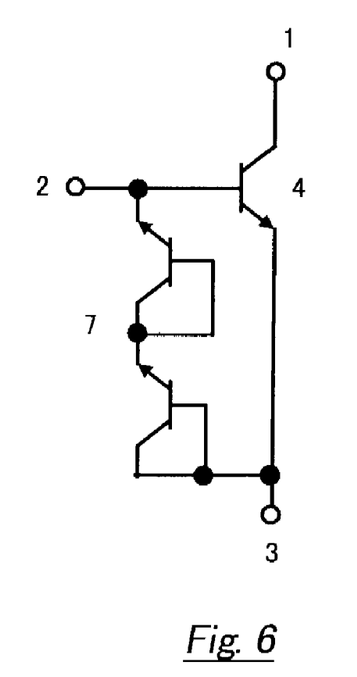
FIG. 6 is a circuit diagram according to a third embodiment of the present invention.

FIG. 6 shows a third embodiment of the present invention. The electrostatic protective device is a device 7 that are composed of two SiGe:C bipolar transistors, which are similar to the equivalent of the first embodiment, connected in series. The base and the collector of the SiGe:C bipolar transistors are short-circuited with each other. According to this embodiment, although the ON-state voltage of the protective device is twice that of the first embodiment to lower an electrostatic discharge resistance, the parasitic capacitance of the electrostatic protective device is reduced to half, which prevents degradation of high-frequency characteristics. Therefore, if a required electrostatic discharge resistance is not tight, this embodiment allows the obtainment of more suitable high-frequency characteristics. If an electrostatic discharge resistance is not tight, it is possible to connect a larger number of SiGe:C or SiGe bipolar transistors in series.

Fourth Embodiment

Figure 7:
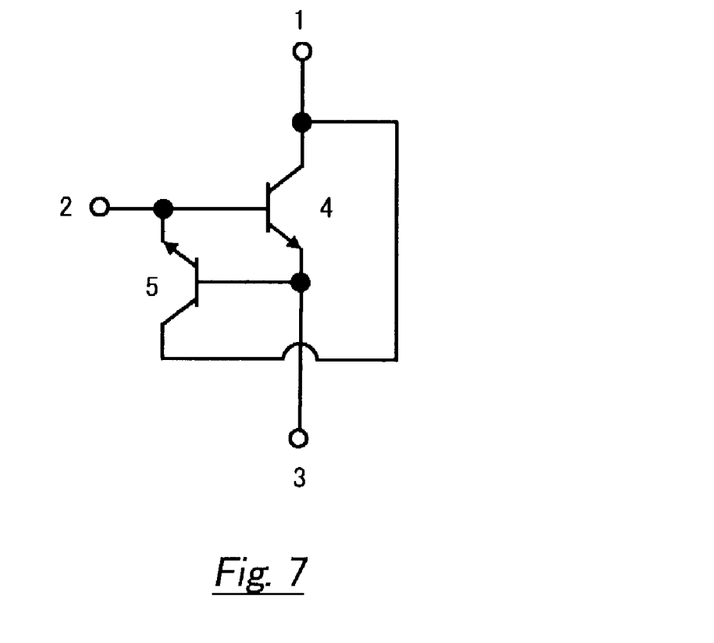
FIG. 7 is a circuit diagram according to a fourth embodiment of the present invention.

FIG. 7 shows a fourth embodiment of the present invention. The collector, base and emitter of the SiGe:C bipolar transistor 5 as an electrostatic protective device are connected with the collector, emitter and base of the SiCe:C bipolar transistor 4 as a circuit to be protected. If static electricity is applied to the base of the SiGe:C bipolar transistor 4, it is not only discharged to the emitter side of the SiGe:C bipolar transistor 4 through the emitter-base junction of the SiGe:C bipolar transistor 5 as an electrostatic protective device, but also discharged to the collector side of the SiGe:C bipolar transistor 4 due to the breakdown between the collector and the emitter of the SiGe:C bipolar transistor 5. This embodiment thus has the advantage of providing protection from electrostatic discharge damage between the base and the collector in addition to between the base and the emitter.

Fifth Embodiment

Figure 8:
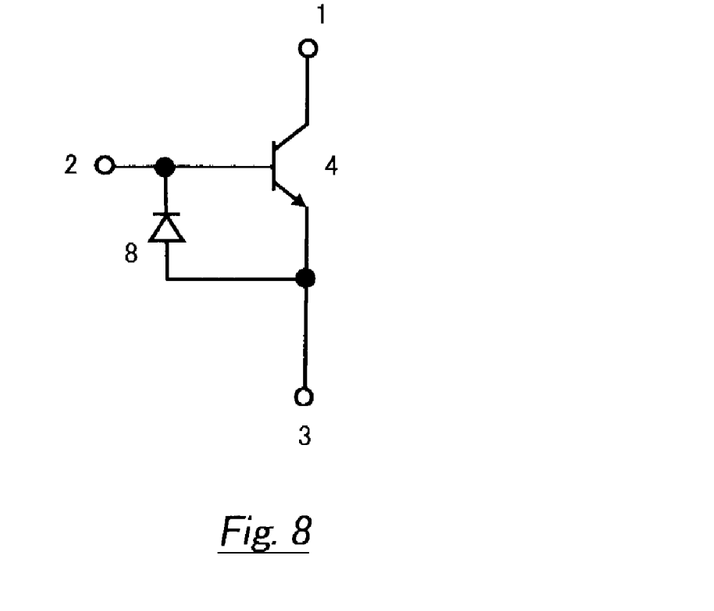
FIG. 8 is a circuit diagram according to a fifth embodiment of the present invention.

FIG. 8 shows a fifth embodiment of the present invention. The electrostatic protective device is a PN junction diode 8 with N-type Si and P-type SiGe. This embodiment uses a diode that is a two-terminal device, which simplifies the structure compared with the use of a SiGe bipolar transistor that is a three-terminal device, thereby enabling further reduction of a device area.

It is apparent that the present invention is not limited to the above embodiment, that may be modified and changed without departing from the scope and spirit of the invention.

What is claimed is:

1. A semiconductor apparatus comprising:
    an electrostatic protective device having a PN junction of N-type Si and P-type SiGe,
    wherein the electrostatic protective device is directly connected with a terminal to receive static electricity and with a terminal to discharge static electricity, and
    wherein a region of the P-type SiGe contains carbon (C).

2. The semiconductor apparatus according to claim 1, wherein
    the electrostatic protective device is a SiGe bipolar transistor, and
    an emitter or a collector of the SiGe bipolar transistor is the N-type Si, and a base of the SiGe bipolar transistor is the P-type SiGe.

3. The semiconductor apparatus according to claim 1, wherein
    the electrostatic protective device is a PN junction diode of N-type Si and P-type SiGe.

4. The semiconductor apparatus according to claim 1, wherein
    the electrostatic protective device is composed of a plurality of PN junctions of the N-type Si and the P-type SiGe connected in series.

5. A semiconductor apparatus comprising:
    an electrostatic protective device having a PN junction of N-type Si and P-type SiGe,
    wherein the electrostatic protective device is directly connected with a terminal to receive static electricity and with a terminal to discharge static electricity, and
    wherein the electrostatic protective device is a SiGe bipolar transistor, and an emitter or a collector of the SiGe bipolar transistor is the N-type Si, and a base of the SiGe bipolar transistor is the P-type SiGe.

6. The semiconductor apparatus according to claim 5, wherein
    the emitter of the N-type Si and the base short-circuited with the collector of the SiGe bipolar transistor are directly connected with a terminal to receive static electricity and with a terminal to discharge static electricity.

7. The semiconductor apparatus according to claim 5, wherein
    the collector of the N-type Si and the base short-circuited with the emitter of SiGe bipolar transistor are directly connected with a terminal to receive static electricity and with a terminal to discharge static electricity.

8. The semiconductor apparatus according to claim 5, wherein
    the SiGe bipolar transistor has an emitter and a collector of the N-type Si, and
    the emitter is directly connected with a terminal to receive static electricity, and the base is directly connected with a terminal to discharge static electricity, and the collector is directly connected with a second terminal to discharge static electricity.

9. A semiconductor apparatus comprising:
    an electrostatic protective device having a PN junction of N-type Si and P-type SiGe,
    wherein the electrostatic protective device is directly connected with a terminal to receive static electricity and with a terminal to discharge static electricity, and
    wherein the electrostatic protective device is a PN junction diode of N-type Si and P-type SiGe.

10. A semiconductor apparatus comprising:
    an electrostatic protective device having a PN junction of N-type Si and P-type SiGe,
    wherein the electrostatic protective device is directly connected with a terminal to receive static electricity and with a terminal to discharge static electricity, and
    wherein the electrostatic protective device is composed of a plurality of PN junctions of the N-type Si and the P-type SiGe connected in series.

* * * * *